(12) United States Patent
Liu et al.

(10) Patent No.: US 8,618,668 B2
(45) Date of Patent: Dec. 31, 2013

(54) SEMICONDUCTOR CONTACT BARRIER

(71) Applicant: Taiwan Semiconductor Manufacturing Company, Ltd., Hsin-Chu (TW)

(72) Inventors: Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/657,351

(22) Filed: Oct. 22, 2012

(65) Prior Publication Data

US 2013/0043546 A1   Feb. 21, 2013

Related U.S. Application Data

(63) Continuation of application No. 13/015,328, filed on Jan. 27, 2011, now Pat. No. 8,294,274, which is a continuation of application No. 12/019,396, filed on Jan. 24, 2008, now Pat. No. 7,897,514.

(51) Int. Cl.
*H01L 23/48* (2006.01)
*H01L 23/52* (2006.01)
*H01L 29/40* (2006.01)

(52) U.S. Cl.
USPC .... 257/774; 257/347; 257/396; 257/E21.006; 257/E21.17; 257/E21.32; 257/E21.229; 257/E21.304; 257/E21.421; 257/E21.545; 438/197; 438/311; 438/682; 438/700

(58) Field of Classification Search
USPC ......... 257/774, 396, 347, 192, 616, 745, 763, 257/769, 770, E21.006, E21.051, E21.17, 257/E21.32, E21.229, E21.304, E21.421, 257/E21.545; 438/197, 311, 700, 682
See application file for complete search history.

(56) References Cited

U.S. PATENT DOCUMENTS

| | | |
|---|---|---|
| 5,695,810 A | 12/1997 | Dubin et al. |
| 5,801,098 A | 9/1998 | Fiordalice et al. |
| 5,907,188 A | 5/1999 | Nakajima et al. |
| 5,942,799 A | 8/1999 | Danek et al. |
| 5,958,508 A | 9/1999 | Adetutu et al. |
| 5,968,333 A | 10/1999 | Nogami et al. |
| 5,985,762 A | 11/1999 | Geffken et al. |
| 5,990,008 A | 11/1999 | Koyama et al. |

(Continued)

OTHER PUBLICATIONS

Pan, J. et al., "Novel Approach to Reduce Source/Drain Series Resistance in High Performance CMOS Devices Using Self-Aligned CoWP Processes for 45nm Node UTSOI Transistors with 20nm Gate Length," 2006 Symposium on VLSI Technology, Digest of Technical Papers, 2006, pp. 184-185, IEEE.

*Primary Examiner* — David Nhu

(74) *Attorney, Agent, or Firm* — Slater & Matsil, L.L.P.

(57) ABSTRACT

System and method for reducing contact resistance and improving barrier properties is provided. An embodiment comprises a dielectric layer and contacts extending through the dielectric layer to connect to conductive regions. A contact barrier layer is formed between the conductive regions and the contacts by electroless plating the conductive regions after openings have been formed through the dielectric layer for the contact. The contact barrier layer is then treated to fill the grain boundary of the contact barrier layer, thereby improving the contact resistance. In another embodiment, the contact barrier layer is formed on the conductive regions by electroless plating prior to the formation of the dielectric layer.

20 Claims, 6 Drawing Sheets

(56) References Cited

U.S. PATENT DOCUMENTS

| | | |
|---|---|---|
| 6,001,415 A | 12/1999 | Nogami et al. |
| 6,054,382 A | 4/2000 | Hsu et al. |
| 6,084,279 A | 7/2000 | Nguyen et al. |
| 6,181,012 B1 | 1/2001 | Edelstein et al. |
| 6,194,310 B1 | 2/2001 | Hsu et al. |
| 6,291,332 B1 | 9/2001 | Yu et al. |
| 6,544,900 B2 | 4/2003 | Raaijmakers et al. |
| 6,602,785 B1 | 8/2003 | Sharan et al. |
| 6,657,249 B2 | 12/2003 | Nishioka et al. |
| 6,713,835 B1 | 3/2004 | Horak et al. |
| 6,797,608 B1 | 9/2004 | Lin |
| 6,800,517 B2 | 10/2004 | Sandhu et al. |
| 6,828,683 B2 | 12/2004 | Li et al. |
| 6,969,675 B2 | 11/2005 | Lin |
| 7,279,118 B2 | 10/2007 | Li et al. |
| 7,897,514 B2 | 3/2011 | Liu et al. |
| 8,294,274 B2 * | 10/2012 | Liu et al. ............ 257/774 |

* cited by examiner

SEMICONDUCTOR CONTACT BARRIER

This application is a continuation of U.S. patent application Ser. No. 13/015,328 filed on Jan. 27, 2011, U.S. Pat. No. 8,294,274, and entitled "Semiconductor Contact Barrier," which is a continuation of U.S. patent application Ser. No. 12/019,396 filed on Jan. 24, 2008, U.S. Pat. No. 7,897,514, and entitled "Semiconductor Contact Barrier," which applications are incorporated herein by reference.

TECHNICAL FIELD

The present invention relates generally to a system and method for forming electrical contacts and, more particularly, to a system and method for forming a barrier layer for electrical contacts.

BACKGROUND

In the race to improve transistor performance as well as to reduce the size of transistors, much research has been done on the contacts that connect a transistor's source and drain regions to the various layers of metallization over the transistor. In the search for better contacts, copper has been researched as a potential method to improve the resistance of the contact, as well as the overall performance of the device as a whole. However, the use of copper has some inherent problems that must be overcome, such as copper's propensity to migrate and cause unwanted reactions with other materials.

FIG. 1 illustrates one attempt to overcome some of these problems of using copper as a contact. FIG. 1 illustrates a substrate 101 with shallow trench isolation (STI) 103, and a device 100 formed on the substrate 101. The device 100 comprises a gate dielectric 105, gate electrode 107, spacers 109, source/drain regions 111, and silicide contacts 113. An inter-layer dielectric (ILD) 115 covers the device 100. Openings are formed in the ILD 115, and contact barrier layers 117, made of a material such as cobalt tungsten phosphide (CoWP), are formed on the silicide contacts 113. A barrier layer 119 is then formed in the openings and the openings are overfilled with copper 121, planarized by a method such as CMP, and connected to later formed metal lines 123 within a dielectric layer 125. The contact barrier layers 117 help to reduce the contact resistance and prevent the copper 121 from migrating and reacting with the silicide contacts 113.

However, this solution, while an improvement over previous methods, does not by itself solve the problems with using copper as a contact. Certain properties of the contact barrier layers 117 need further improvement for its full application in devices. For example, the contact barrier layers 117 formed as described above have grain boundaries at their interfaces with other materials that are unfilled. These unfilled grain boundaries increase the potential contact resistance, making this solution less desirable.

Because of these and other problems associated with the current methods, what is needed is a contact barrier that has improved properties to lower the contact resistance of the contact and work to prevent copper from migrating and having unwanted reactions with adjacent layers.

SUMMARY OF THE INVENTION

These and other problems are generally solved or circumvented, and technical advantages are generally achieved, by preferred embodiments of the present invention that provide a structure and method for forming contacts to conductive regions of a semiconductor device.

One aspect of the present invention involves a method of forming a contact. The method includes forming a conductive region and then forming a dielectric layer over the conductive region. At least one opening is formed through the dielectric layer to the conductive region, and a contact barrier layer of a first material is selectively formed at the bottom of the opening and in contact with the conductive region. The contact barrier layer is then treated to form a second material, and the contact is completed by filling the opening with a conductive material.

Another aspect of the present invention involves a method of forming a contact to a conductive region. A conductive region is provided and a dielectric layer is formed over the conductive region. A conductive plug is formed through the dielectric layer over the conductive region, and a treated conductive layer is formed interposed between the conductive region and the conductive plug.

Yet another aspect of the present invention involves a method for connecting two conductive regions through a dielectric layer. This method comprises providing a conductive region and selectively forming a contact barrier layer of a first material on the exposed regions of the conductive region, and then transforming at least a portion of the first material into a second material by introducing impurities. A dielectric layer is formed over the conductive region, and an opening is formed through the dielectric layer over at least a portion of the conductive region, and the opening is filled with conductive material.

Yet another aspect of the present invention involves a semiconductor device comprising a first conductive layer and a dielectric layer over the first conductive layer. An opening is located through the dielectric layer to the first conductive layer, the opening comprising sidewalls and a bottom. A treated conductive material is within the opening, the treated conductive material located along the bottom of the opening and in contact with the first conductive layer. A conductive material is located along the sidewalls of the opening and over the treated conductive material.

Yet another aspect of the present invention involves a semiconductor device comprising a conductive region with a top surface and a first grain-filled conductive barrier layer over substantially the entire top surface of the conductive region. A dielectric layer is over the first grain-filled conductive barrier layer and a conductive material extends through the dielectric layer and in contact with the first conductive barrier layer.

Yet another aspect of the present invention involves a semiconductor device comprising a transistor having a conductive region and a first silicide region over the conductive region. A dielectric layer is over the silicide region and a first conductive material extends through the dielectric layer and is in electrical contact with the silicide region, the first conductive material in contact with at least a portion of the dielectric layer. A first treated barrier is between the silicide region and the first conductive material.

Yet another aspect of the present invention involves a semiconductor device comprising a first conductive region in a substrate, a first gate electrode over the substrate, and a first treated conductive material in physical contact with the first conductive region. A second treated conductive material is in physical contact with the first gate electrode, and a dielectric layer is over the first conductive region and over the first gate electrode. A first contact extends through the dielectric layer and making electrical contact with the first treated conductive material.

Yet another aspect of the present invention involves a semiconductor device comprising a conductive region in a substrate and a first grain-filled conductive region in physical contact with a surface of the conductive region. A contact is in physical connection with the first grain-filled conductive region.

Yet another aspect of the present invention involves a method of manufacturing a semiconductor device comprising forming a first conductive region within a substrate and depositing a second conductive region over the first conductive region, the second conductive region having a grain boundary. The grain boundary of the second conductive region is filled to form a grain-filled conductive material. A dielectric material is deposited over the first conductive region, and a portion of the dielectric material is removed to form an opening. A conductive material is placed in the opening to make electrical contact with the grain-filled conductive material.

By using these methods to form the contacts described, the contact resistance between the contact and the region to be contacted can be reduced. This will result in an overall reduction in the resistance of the device, and, accordingly, better performance of the device.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to forming a contact barrier layer to the source/drain regions of a field effect transistor. The invention may also be applied, however, to other contacts and vias such as those found through an interlayer dielectric layer.

Figure 1:
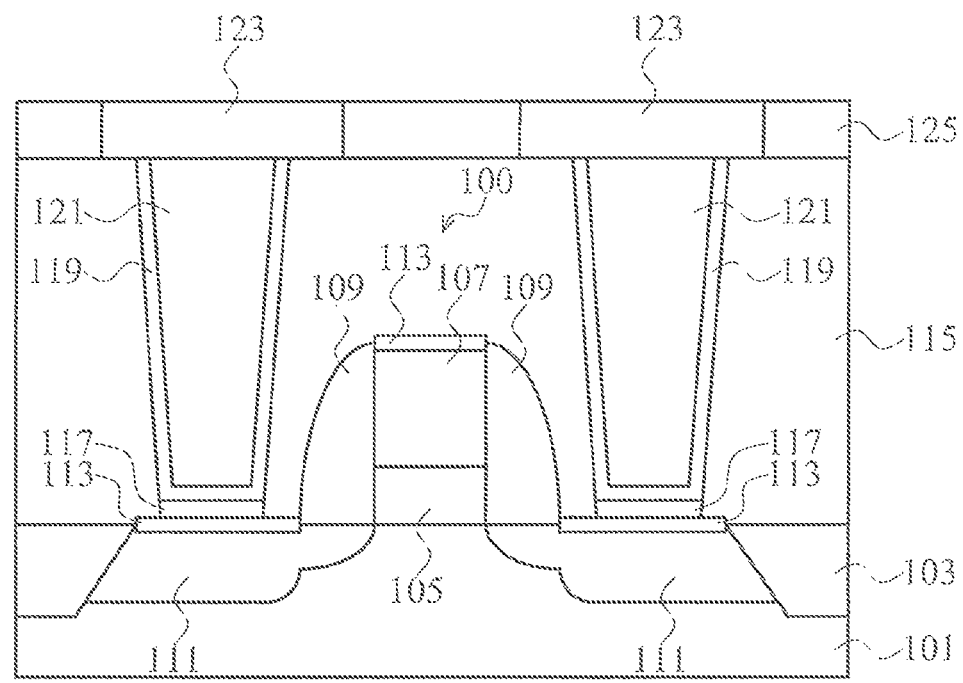
FIG. 1 illustrates a prior art device with untreated contact barrier layers.
Figure 2:
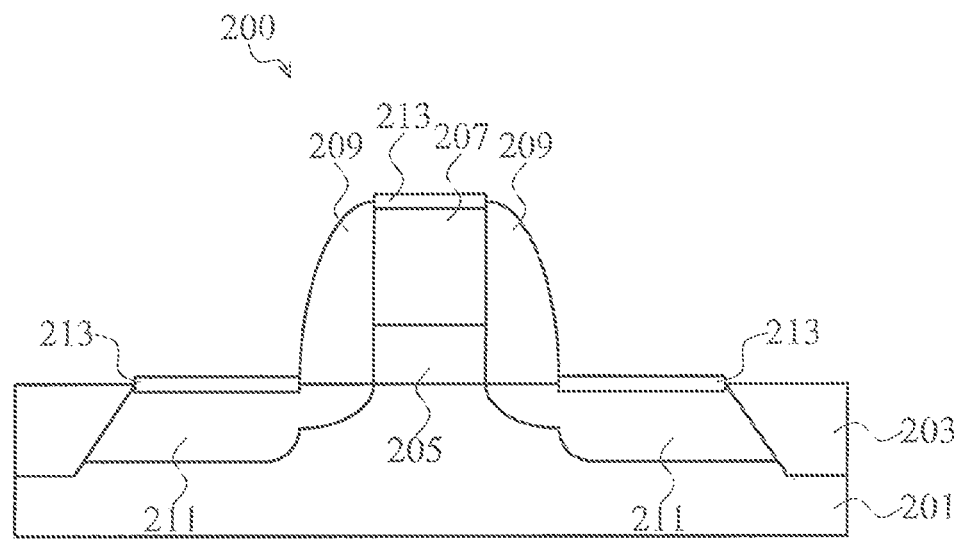
FIGS. 2-8 illustrate intermediate steps in the formation of contact barrier layers and contacts in accordance with an embodiment of the present invention.

With reference now to FIG. 2, there is shown a transistor 200 formed on a substrate 201 with shallow trench isolations (STIs) 203 formed therein. The transistor 200 generally comprises a gate dielectric 205, gate electrode 207, spacers 209, source/drain regions 211, and silicide contacts 213.

The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof Other substrates that may be used include multi-layered substrates, gradient substrates, or hybrid orientation substrates.

The STIs 203 are generally formed by etching the substrate 201 to form a trench and filling the trench with a dielectric material as is known in the art. Preferably, the STIs 203 are filled with a dielectric material such as an oxide material, a high-density plasma (HDP) oxide, or the like, formed by conventional methods known in the art.

Gate dielectric 205 and gate electrode 207 may be formed and patterned on the substrate 201 by any suitable process known in the art. The gate dielectric 205 is preferably a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. Preferably, the gate dielectric 205 has a relative permittivity value greater than about 4.

In an embodiment in which the gate dielectric 205 comprises an oxide layer, the gate dielectric 205 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric 205 is between about 8 Å to about 50 Å in thickness, and is preferably about 16 Å in thickness.

The gate electrode 207 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 207 is poly-silicon, the gate electrode 207 may be formed by depositing doped or undoped poly-silicon by low-pressure chemical vapor deposition (LPCVD) to a thickness in the range of about 100 Å to about 2,500 Å, but more preferably about 1,500 Å.

Spacers 209 are formed on the sidewalls of the gate dielectric 205 and the gate electrode 207. The spacers 209 are typically formed by blanket depositing a spacer layer (not shown) on the previously formed structure. The spacer layer preferably comprises SiN, oxynitride, SiC, SiON, oxide, and the like, and is preferably formed by commonly used methods such as chemical vapor deposition (CVD), plasma enhanced CVD, sputter, and other methods known in the art. The spacer layer is then patterned to form the spacers 209, preferably by anisotropically etching to remove the spacer layer from the horizontal surfaces of the structure.

Source/drain regions 211 are formed in the substrate 201 on opposing sides of the gate dielectric 205. In an embodiment in which the substrate 201 is an n-type substrate, the source/drain regions 211 are preferably formed by implanting appropriate p-type dopants such as boron, gallium, indium, or the like. Alternatively, in an embodiment in which the substrate 201 is a p-type substrate, the source/drain regions 211 may be formed by implanting appropriate n-type dopants such as phosphorous, arsenic, or the like. These source/drain regions 211 are implanted using the gate dielectric 205, gate electrode 207 and the gate spacers 209 as masks.

It should be noted that one of ordinary skill in the art will realize that many other processes, steps, or the like may be used to form these source/drain regions 211. For example, one of ordinary skill in the art will realize that a plurality of implants may be performed using various combinations of spacers and liners to form source/drain regions having a specific shape or characteristic suitable for a particular purpose. Any of these processes may be used to form the source/drain regions 211, and the above description is not meant to limit the present invention to the steps presented above.

Optionally, silicide contacts 213 are formed from a portion of the source/drain regions 211 and the gate electrode 207. The silicide contacts 213 preferably comprise nickel. However, other commonly used metals, such as titanium, cobalt, palladium, platinum, erbium, and the like, can also be used. As is known in the art, the silicidation is preferably performed by blanket deposition of an appropriate metal layer, followed by an annealing step in which the metal reacts with the underlying exposed silicon. Unreacted metal is then removed, preferably with a selective etch process. The thickness of the silicide contacts 213 is preferably between about 3 nm and about 50 nm, with a preferred thickness of about 10 nm. Alternatively, the silicide contacts 213 may be left off, leaving only the substrate 201 as the point of contact, or else a metal layer (not shown) may be formed to serve as the contact point for the source/drain regions 211.

Figure 3:
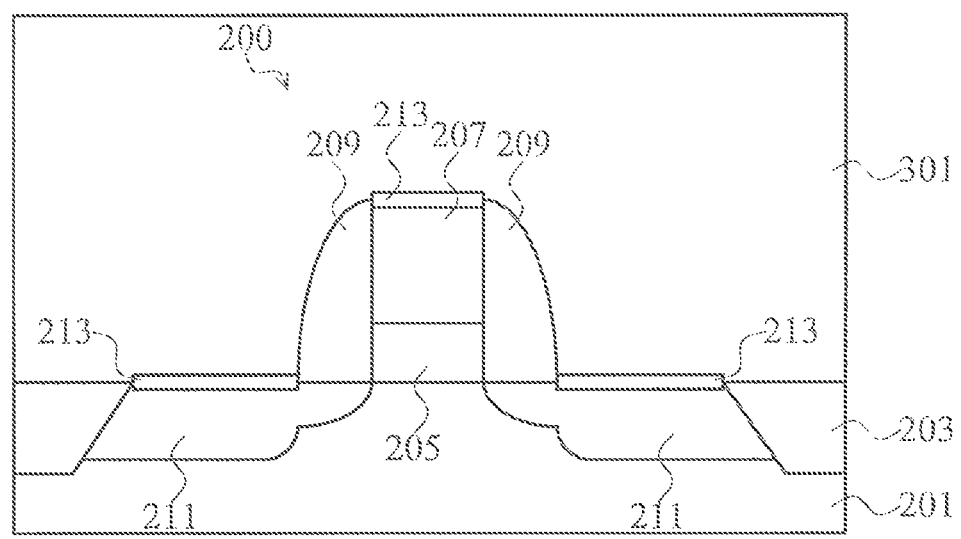

FIG. 3 illustrates the formation of an inter-layer dielectric (ILD) 301 over the transistor 200. The ILD 301 may be formed by chemical vapor deposition, sputtering, or any other methods known and used in the art for forming an ILD 301. The ILD 301 typically has a planarized surface and may be comprised of silicon oxide, although other materials, such as other high-k materials, could alternatively be utilized.

Figure 4:
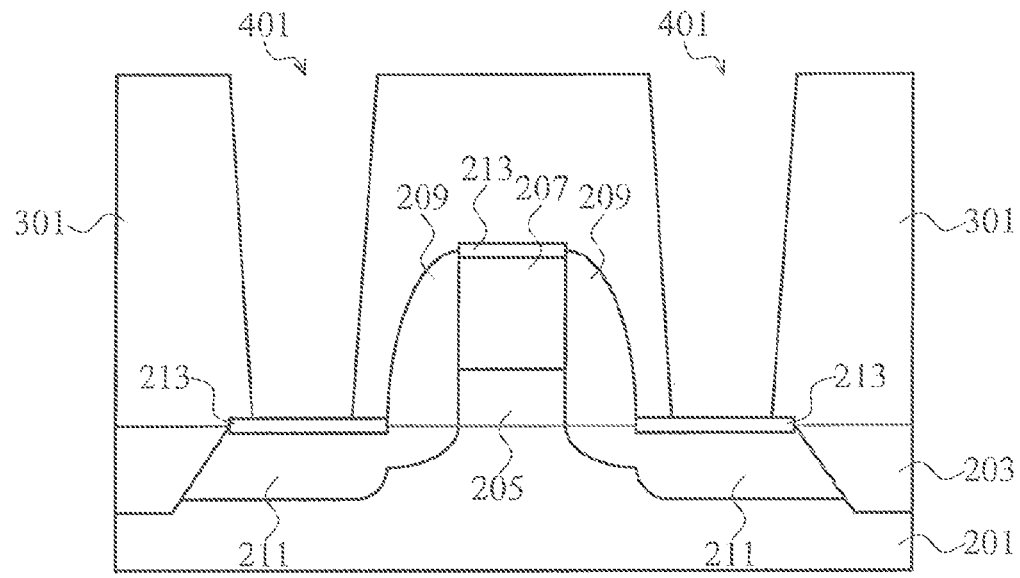

FIG. 4 illustrates the formation of openings 401 through the ILD 301 to the silicide contacts 213. Openings 401 may be formed in the ILD 301 in accordance with known photolithography and etching techniques. Generally, photolithography techniques involve depositing a photoresist material, which is masked, exposed, and developed to expose portions of the ILD 301 that are to be removed. The remaining photoresist material protects the underlying material from subsequent processing steps, such as etching. In the preferred embodiment, photoresist material is utilized to create a patterned mask to define openings 401, but additional masks, such as a hardmask, may also be used. The etching process may be an anisotropic or isotropic etch process, but preferably is an anisotropic dry etch process. In a preferred embodiment, the etch process is continued until at least a portion of the silicide contacts 213 are exposed.

Figure 5:
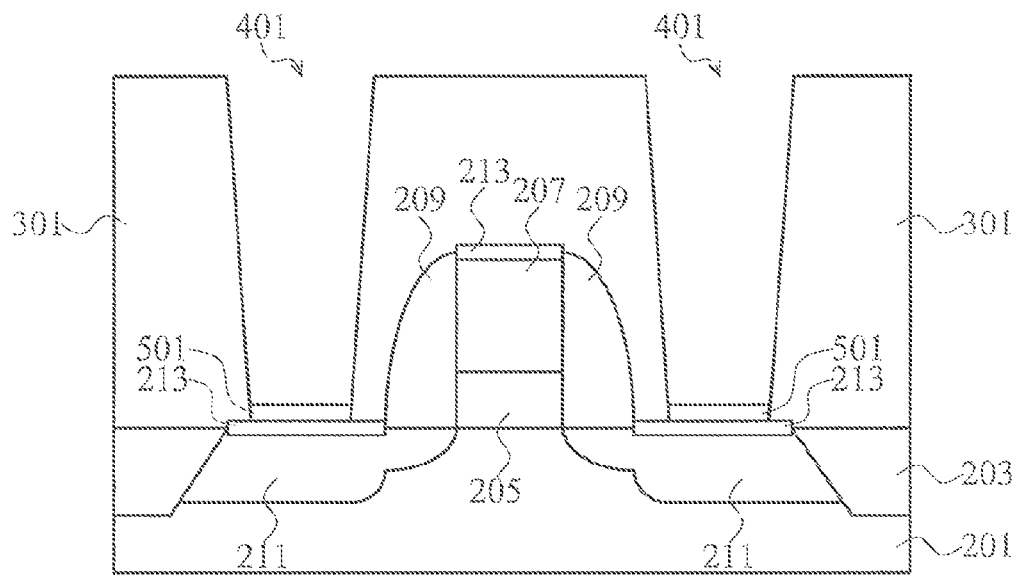

FIG. 5 illustrates the formation of contact barrier layers 501 on the exposed portions of the silicide contacts 213 within openings 401. If no silicide contacts 213 are being used, the contact barrier layers 501 are preferably formed on either the substrate or the metal layer, whichever has been chosen as the point of contact for the source/drain regions 211. In the preferred embodiment, contact barrier layers 501 are selectively formed by electroless plating. As the silicide contacts 213 are conductive and the ILD 301 is not conductive, contact barrier layers 501 will be formed only on silicide contacts 213, and no contact barrier layer 501 is formed on the top surface of the ILD 301.

Contact barrier layers 501 are preferably formed of cobalt tungsten (CoW). However, other materials, such as cobalt tungsten phosphide (CoWP), cobalt tungsten boride (CoWB), combinations of these, or the like, could alternatively be used. Contact barrier layers 501 are preferably formed with a thickness of between about 5 nm and about 50 nm, with a preferred thickness of about 20 nm.

Figure 6:
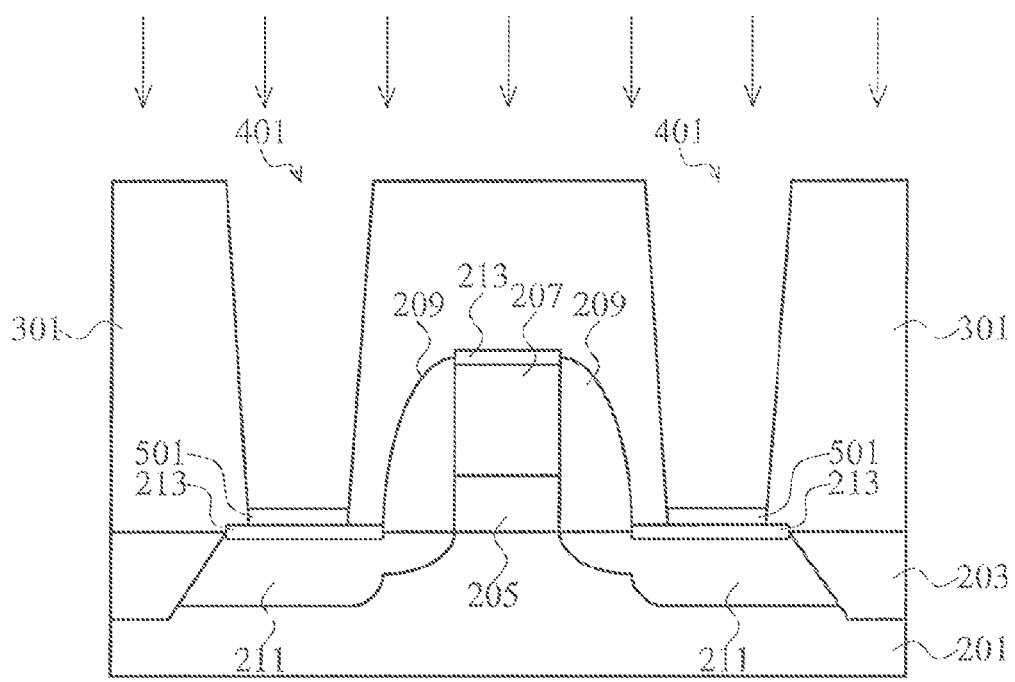

FIG. 6 illustrates a further treatment of the contact barrier layers 501. The contact barrier layers 501 are treated so as to substantially fill the grain boundary of the contact barrier layers 501 and form a grain-filled contact barrier layers 501. This treatment is preferably performed using, either individually or in combination, silane ($SiH_4$), germane ($GeH_4$), or ammonia ($NH_3$), although other materials, such as $C_2H_4$ or $CH_4$ may alternatively be used. This treatment of the contact barrier layers 501 works to fill the grain boundary of the contact barrier layers 501, thereby improving the contact resistance between the silicide contacts 213 and the later-formed contacts (whose formation is further described below with reference to FIGS. 7-8) and further prevents migration through the contact barrier layers 501.

The treatment is preferably performed by a plasma treatment. In this plasma treatment the contact barrier layers 501 are exposed to a plasma of silane, germane, or ammonia, either individually or in combination as described above, at a pressure of between about 0.1 torr and about 100 ton, and a preferred pressure of about 4 ton, and at a temperature of between about 200° C. and about 450° C., and a preferred temperature of about 400° C. Additionally, the plasma treatment is preferably performed at an excitation frequency of between about 0.1 MHz and about 10 MHz, with a preferred frequency of about 2 MHz, and a power of between about 200 W and about 1200 W, with a preferred power of about 600 W. However, other treatment processes, such as $C_2H_4$ or $CH_4$ may alternatively be used.

The treatment of the contact barrier layers 501 will form different materials depending upon the starting material of the contact barrier layers 501 as well as which materials are used to treat the contact barrier layers 501. For example, if the contact barrier layers 501 are initially formed with CoW, the treated contact barrier layers 501 may be CoWGe, CoWSi, CoWGeN, CoWSiN, or CoWGeSiN, depending on whether the treatment was performed with germane, silane, germane and ammonia, silane and ammonia, or silane and germane and ammonia, respectively. As a further example, if the contact barrier layers 501 are initially formed using CoWP, the treated contact barrier layers 501 may be CoWPGe, CoWPSi, CoWGePN, CoWPSiN, or CoWPGeSiN, depending on whether the treatment was performed with germane, silane, germane and ammonia, silane and ammonia, or silane and germane and ammonia, respectively. As another example, if the contact barrier layers 501 are initially formed using CoWB, the treated contact barrier layers 501 may be CoWBGe, CoWBSi, CoWGeBN, CoWBSiN, or CoWBGeSiN, depending on whether the treatment was performed with germane, silane, germane and ammonia, silane and ammonia, or silane and germane and ammonia, respectively. However, while these examples are listed for convenience, this list is meant for illustrative purposes only and is not meant to be exclusive of other possible combinations. All combinations that may be formed from treating the contact barrier layers to fill the grain boundary are fully intended to be within the scope of the present invention.

Figure 7:
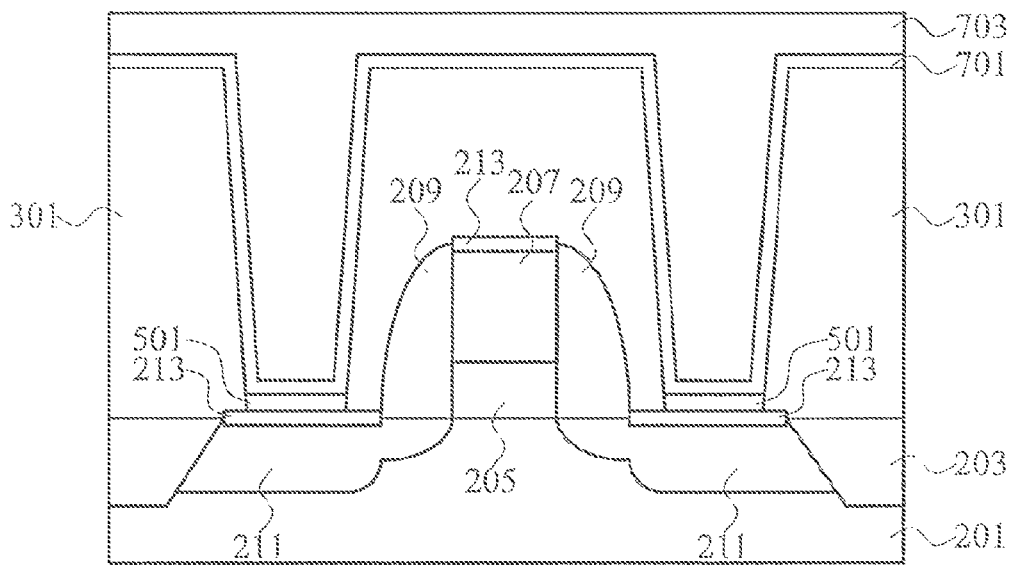

FIG. 7 illustrates the formation of a diffusion barrier layer 701 and a conductive material 703. Diffusion barrier layer 701 is preferably formed through a blanket formation that covers the sidewalls and bottoms of openings 401 over the contact barrier layer 501. Diffusion barrier layer 701 is preferably formed of a material comprising titanium, titanium nitride, tantalum, tantalum nitride, ruthenium, ruthenium nitride, titanium compound, tantalum compound, or combinations thereof. The preferred formation methods include physical vapor deposition (PVD), atomic layer deposition (ALD), and other commonly used methods.

A seed layer (not shown), which preferably includes copper or copper alloys, is preferably formed on the diffusion barrier layer 701. A conductive material 703 is then filled into openings 401, preferably using plating. Conductive material 703 preferably comprises copper or copper alloys, although other materials such as aluminum, tungsten, silver, or combinations thereof, can also be used.

Figure 8:
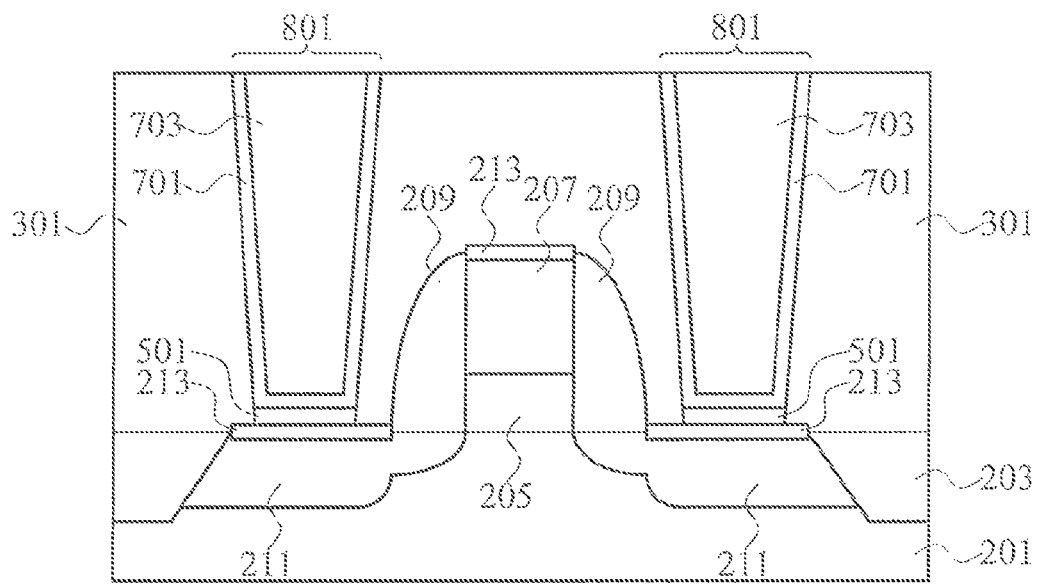

FIG. 8 illustrates the formation of contacts 801 to the silicide contacts 213. Preferably, a chemical mechanical polish (CMP) is performed to remove excess materials, and the top surface of the conductive material 703 and diffusion barrier layer 701 is reduced until level with a top surface of the ILD 301. As a result, only the material within openings 401 remain, and contacts 801 are formed.

Figure 9:
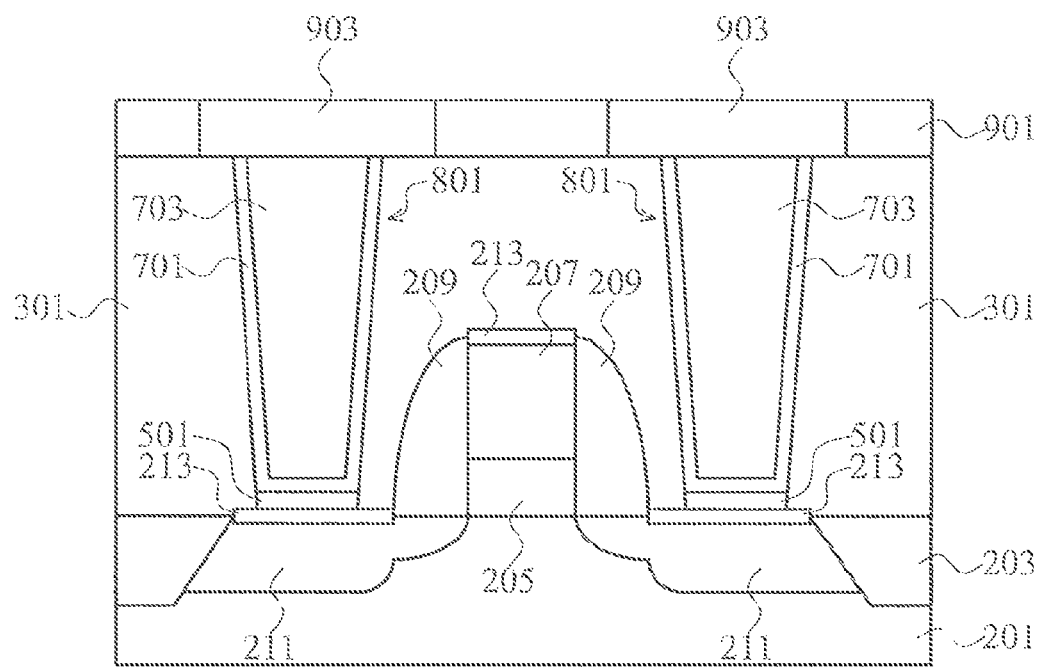
FIG. 9 illustrates contact barrier layers in contact with a portion of a silicide region in accordance with an embodiment of the present invention.

FIG. 9 illustrates the formation of metal lines 903 connected to the contacts 801. A preferred method for forming the metal lines 903 is the damascene method. Generally, this method involves forming a dielectric layer 901 and then forming openings in the dielectric layer 901. The openings are typically formed using conventional lithographic and etching techniques as discussed above. After the openings are formed, the openings are filled with copper or copper alloys to form the metal lines 903. Excess metal material on the surface of the dielectric layer 901 is then removed by a planarization process, such as chemical mechanical planarization (CMP).

Additionally, while not explicitly shown in the Figures, it should be understood that the process described above (with respect to FIGS. 2-9) to make a contact barrier layer 501 over a source/drain region 211 may also be used to form a contact barrier layer 501 on the gate electrode 207 or any other conductive contact, such as a via. This process would occur at a different cross section than that shown in FIGS. 2-9, but the formation of a contact 801 to the gate electrode 207 is fully intended to be included within the scope of the present invention.

Figure 10:
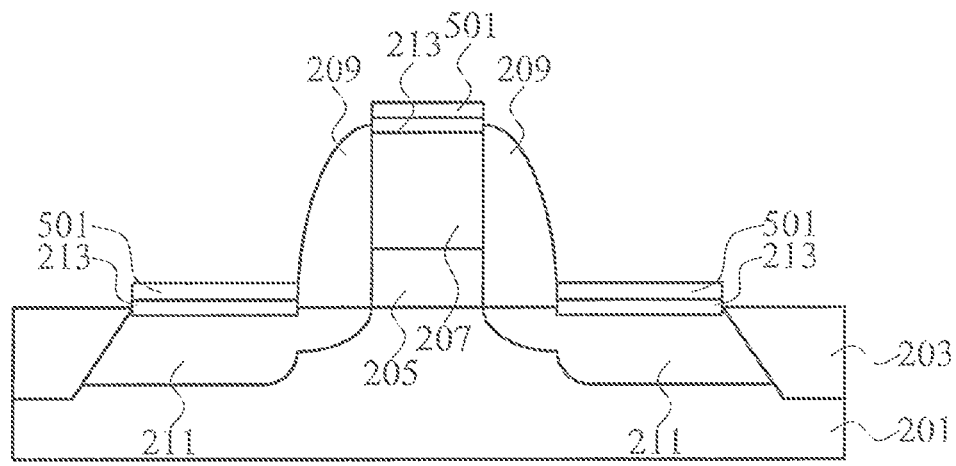
FIGS. 10-11 illustrate contact barrier layers in contact with substantially all of the silicide region in accordance with an embodiment of the present invention.

FIG. 10 illustrates another embodiment of the present invention in which the contact barrier 501 is formed prior to the deposition of the ILD 301. In this embodiment, after the formation of the silicide contacts 213 and prior to the deposition of the ILD 301, electroless plating is performed (preferably as described above with reference to FIG. 5) so as to form the contact barrier layers 501 on the conductive regions of the transistor 200. This procedure forms the contact barrier layers 501 on substantially all of the silicide contacts 213 above the source/drain regions 211 and also on the silicide contacts 213 above the gate electrode 207.

Once the contact barrier layers 501 have been formed, the contact barrier layers 501 are then treated in a similar fashion as described above with reference to FIG. 6. The treatment is preferably performed prior to the formation of the ILD 301, thereby treating substantially all of the exposed contact barrier layers 501. Alternatively, the ILD 301 and openings 401 may be formed as described above with reference to FIGS. 3 and 4 prior to the treatment of the exposed portions of the contact barrier layers 501, thereby allowing only a portion of the contact barrier layers 501 to be treated. Each of these methods is intended to be included within the scope of the present invention.

Figure 11:
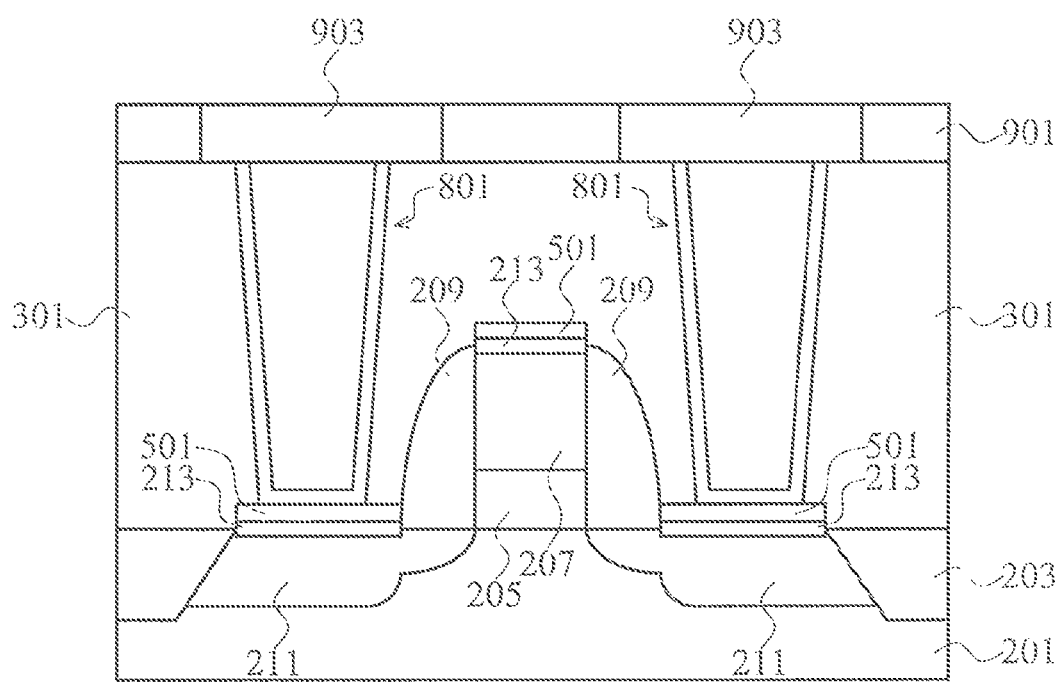

FIG. 11 illustrates the formation of the remainder of the contacts 801 in this embodiment. The ILD 301 (if not already formed), barrier layers 701, conductive overfill 703, contacts 801, and metal lines 903 are preferably formed as described above with reference to FIGS. 2-9 to complete the formation of the contacts 801. However, in this embodiment, the contacts 801 are only in contact with a portion of the top of the contact barrier layers 501, instead of in contact with substantially the entire top surface of the contact barrier layers 501.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A semiconductor device comprising:
   a first conductive region in a substrate;
   a first gate electrode over the substrate;
   a first treated conductive material in a physical contact with the first conductive region;
   a second treated conductive material in a physical contact with the first gate electrode;
   a dielectric layer over the first conductive region and over the first gate electrode; and
   a first contact extending through the dielectric layer and making an electrical contact with the first treated conductive material.

2. The semiconductor device of claim 1, wherein the second treated conductive material comprises a material selected from the group consisting essentially of CoWGe, CoWSi, CoWGeN, or CoWSiN.

3. The semiconductor device of claim 1, wherein the second treated conductive material comprises a material selected from the group consisting essentially of CoWPGe, CoWPSi, CoWGePN, CoWPSiN, or CoWPGeSiN.

4. The semiconductor device of claim 1, wherein the second treated conductive material comprises a material selected from the group consisting essentially of CoWBGe, CoWBSi, CoWGeBN, CoWBSiN, or CoWBGeSiN.

5. The semiconductor device of claim 1, wherein the second treated conductive material comprises silicon.

6. The semiconductor device of claim 1, wherein the second treated conductive material comprises germanium.

7. The semiconductor device of claim 1, wherein the second treated conductive material comprises nitrogen.

8. The semiconductor device of claim 1, wherein the gate electrode further comprises a silicide region adjacent to the second treated conductive material.

9. The semiconductor device of claim 1, wherein the first conductive region is part of a substrate with source/drain regions located therein.

10. A semiconductor device comprising:
    a conductive region in a substrate;
    a first grain-filled conductive region in a physical contact with a surface of the conductive region; and
    a contact in physical connection with the first grain-filled conductive region.

11. The semiconductor device of claim 10, wherein the first grain-filled conductive region comprises a material selected from the group consisting essentially of CoWGe, CoWSi, CoWGeN, or CoWSiN.

12. The semiconductor device of claim 10, wherein the first grain-filled conductive region comprises a material selected from the group consisting essentially of CoWPGe, CoWPSi, CoWGePN, CoWPSiN, or CoWPGeSiN.

13. The semiconductor device of claim 10, wherein the first grain-filled conductive region comprises a material selected from the group consisting essentially of CoWBGe, CoWBSi, CoWGeBN, CoWBSiN, or CoWBGeSiN.

14. The semiconductor device of claim 10 further comprising a transistor, wherein the transistor comprises:
   the conductive region;
   a gate dielectric adjacent to the conductive region;
   a gate electrode over the gate dielectric; and
   a second grain-filled conductive region over the gate electrode.

15. A method of manufacturing a semiconductor device, the method comprising:
   forming a first conductive region within a substrate;
   depositing a second conductive region over the first conductive region, the second conductive region having a grain boundary;
   filling the grain boundary of the second conductive region to form a grain-filled conductive material;
   depositing a dielectric material over the first conductive region;
   removing a portion of the dielectric material to form an opening; and
   placing a conductive material in the opening to make an electrical contact with the grain-filled conductive material.

16. The method of claim 15, wherein the second conductive region comprises a material selected from the group consisting essentially of CoW, CoWB, or CoWP.

17. The method of claim 15, wherein the filling the grain boundary is performed at least in part by treating with silane.

18. The method of claim 15, wherein the filling the grain boundary is performed at least in part by treating with ammonia.

19. The method of claim 15, wherein the filling the grain boundary is performed at least in part by treating with germane.

20. The method of claim 15, wherein the filling the grain boundary is performed at least in part by treating with a combination of silane, germane and ammonia.

\* \* \* \* \*